US006278387B1

(12) United States Patent
Rayskiy

(10) Patent No.: US 6,278,387 B1
(45) Date of Patent: Aug. 21, 2001

(54) AUDIO ENCODER AND DECODER UTILIZING TIME SCALING FOR VARIABLE PLAYBACK

(75) Inventor: Maksim Y. Rayskiy, Tustin, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/407,465

(22) Filed: Sep. 28, 1999

(51) Int. Cl.[7] .................................................... H03M 7/00

(52) U.S. Cl. ................................ 341/61; 389/35; 389/34; 370/321; 370/326; 370/337; 370/260; 370/265

(58) Field of Search ............................... 341/50, 61, 143, 341/200, 144, 110

(56) References Cited

U.S. PATENT DOCUMENTS

| | | | | |
|---|---|---|---|---|
| 4,862,168 | * | 8/1989 | Beard | 341/140 |
| 4,933,675 | * | 6/1990 | Beard | 341/110 |
| 5,451,954 | * | 9/1995 | Davis et al. | 341/200 |
| 5,712,635 | * | 1/1998 | Wilson et al. | 341/144 |
| 5,786,778 | * | 7/1998 | Adam et al. | 341/61 |
| 5,896,099 | * | 4/1999 | Yamauchi | 341/50 |

* cited by examiner

*Primary Examiner*—Michael Tokar
*Assistant Examiner*—Lam T. Mai
(74) *Attorney, Agent, or Firm*—Akin, Gump, Strauss, Hauer & Feld, L.L.P.; H. Shannon Tyson, Jr.

(57) ABSTRACT

An audio codec having an encoder and a decoder is disclosed. The encoder enables the compression of an audio signal for transmission or storage while the decoder receives a compressed audio signal for playback. A time scaling module within the decoder allows variation of the playback rate of the compressed audio signal. Further, no significant depreciation in the quality of pitch occurs as a result of varying the playback rate. The codec features a control for independently varying the playback rate and a module for delivering pitch compensation. The encoder utilizes a sub-band coding scheme (e.g., MPEG-1 and MPEG-2) wherein an audio signal is split into at least two frequency sub-bands for compression. Using a filter bank having two filters, for example, the audio signal is split into the frequency sub-bands. An decoder having a time scaling module is further disclosed. The time scaling module time stretches or compresses an audio signal as desired using a synchronized overlap and add (SOLA) algorithm. The time scaling module includes a processor, an input buffer, and an output buffer. Using SOLA, input and output frames are initially formed within the buffers, and subsequently, the input and output frames are concatenated within a predetermined search range to accomplish time stretching or time compression.

23 Claims, 6 Drawing Sheets

AUDIO ENCODER AND DECODER UTILIZING TIME SCALING FOR VARIABLE PLAYBACK

BACKGROUND

1. Technical Field

The present invention relates to the field of encoding and decoding of audio signals. More specifically, it relates to audio encoding and decoding systems (including MPEG-1 and MPEG-2 compliant systems) that enable variable playback of audio signals.

2. Description of Related Art

A conventional audio encoding system typically compresses an audio signal either to conserve storage space or prior to transmitting the audio signal. One method of compression involves the splitting of the audio signal into several frequency sub-bands before encoding (e.g., as utilized by motion picture expert group standards, MPEG-1 and MPEG-2 compliant encoding systems).

Conventional MEPG-1 and MPEG-2 compliant systems define several encoding schemes that utilize sub-band filtering for encoding audio-visual information. After encoding an audio signal using any one of these schemes, the encoded signal is either transmitted or stored for play back at some subsequent time. An audio decoder is then employed to decompress the encoded signal for play back.

When the encoded audio signal is played back at a normal rate using a conventional audio decoder system, the quality of the audio signal is relatively high. The user, however, may wish to increase or decrease the playback rate, e.g. at twice (2×) the normal speed. One example concerns the playback of video film for review where users wish to increase or decrease the rate of playback.

Conventional decoder systems are unable to playback audio signals at speeds other than normal. Further disadvantages of the related art will become apparent to one skilled in the art through comparison of the related art with the drawings and the remainder of the specification.

SUMMARY OF THE INVENTION

Various aspects of the present invention can be found in an audio codec that includes an encoder for encoding a first audio signal and a decoder for decoding a second audio signal. Also included is a rate adjust module, that permits variable playback of the second audio signal. While the first audio signal may be PCM samples stored on a storage media, the second audio signal may be a compressed bit stream received through a communication channel. Alternatively, the second audio is signal may be a compressed bit stream of the first audio signal.

The encoder includes an input filter bank that splits the first and second audio signals into a first, second, and up to thirty-two sub-band frequency signals, respectively, as specified under MPEG-1 and MPEG-2. The encoder further includes a psycho-acoustic model, a bit allocate circuitry, a formatter, and an output interface that outputs a compressed audio bit stream corresponding to the received PCM samples.

The decoder includes an input interface, an unformatter, an inverse bit allocate decode, and a time scaling module that time stretches received input samples within the time domain for each of the first and second frequency sub-bands to enable variable playback of the received (compressed) audio bit stream. The decoder further includes an output filter bank, and a digital to analog converter that converts the input samples to a corresponding analog signal.

In one embodiment, the time scaling module forms the input samples into an input frame and an output frame, overlaps the input and the output frames at a best averaging point, and averages the overlapped portions of the input and output frames at the best averaging point. Typically, the best average point is within a search range that has a minimum and a maximum value (in samples). The minimum and the maximum value each sub-band, is predetermined based on the sampling frequency of the audio samples. The time scaling module time may either compress or expand the audio samples for playback.

Aspects of the present invention may also be found in a method utilized by a time scaling system to manipulate samples of an audio signal. The method includes receiving the audio samples having a first and a second sub-band frequency, forming an input and a first output frame using the audio samples, computing a best averaging point within a search range for overlapping the input and the first output frame, overlapping the input frame and the first output frame at the averaging point by fading in and fading out the audio samples, and averaging the input and the first output frame at the best averaging point to form a second output frame. In utilizing audio samples to form an input and an output frame, the number of audio samples within an input frame may be determined. The number of audio samples within an input frame may be fixed or user-selectable.

Other aspects of the present invention will become apparent with further reference to the drawings and specification which follow.

DETAILED DESCRIPTION OF DRAWINGS

Figure 1:
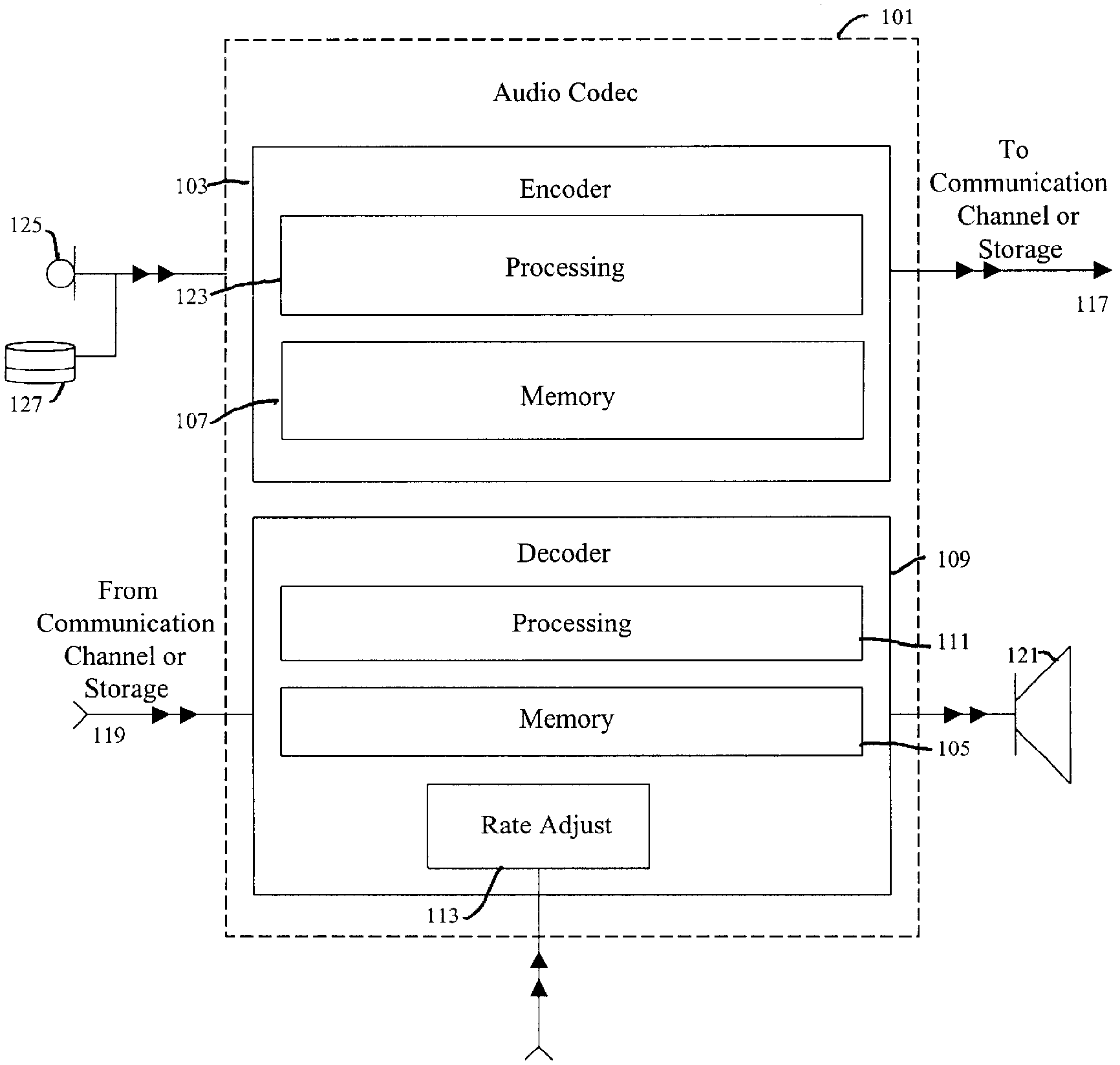
FIG. 1 is an exemplary schematic block diagram of an audio codec illustrating variable playback of audio signals with no change in pitch.

FIG. 1 is an exemplary schematic block diagram of an audio codec illustrating variable playback of audio signals with no change in pitch. More specifically, an audio codec 101 enables the encoding of signals for compression, and the decoding of audio signals to permit variable playback.

A user wishing to utilize the codec 101 inputs a voice signal via a microphone 125. The microphone 125 receives the voice signal and generates a corresponding electrical audio signal. The audio signal is sampled and converted to a digital signal, typically a 16 bit pulse code modulation (PCM) signal, for example. Alternatively, the codec 101 may receive raw PCM samples within a file stored on a storage media 127, for example.

The codec 101 comprises a processing circuitry 123 having a memory 107. The processing circuitry 123 in response to receiving the electrical audio signal (analog), implements A/D conversion, and converts the analog audio signal into a corresponding digital signal. In addition, the codec 101 implements a quantization process wherein the digital signal is mapped into code word to form a compressed bit stream. This compressed bit stream may be transmitted via the output interface 117 to storage or for transmission through a communication channel.

In addition to its encoding functionality, the codec 101 can decode a compressed bit stream. A decoder 109 located within the codec 101 receives the compressed bit stream through an input interface 119, communicatively coupled to a storage media or a communication channel. On receiving the bit stream, the decoder 109 extracts all information and outputs corresponding PCM samples for playback. To extract information, a processing circuitry 111 and memory 105 typically unformats and inverse quantizes the compressed bit stream for unencoding. The unencoded signal is then converted to a continuous analog signal using an A/D converter (not shown). Thereafter, a speaker 121 outputs a corresponding sound signal that may be perceived by users. Using a rate adjust 113, a user can set the desired playback rate of the PCM samples. The decoder 109 supports both full and half-duplex communication and may simultaneously encode audio PCM samples while decoding a compressed bit stream.

Figure 2:
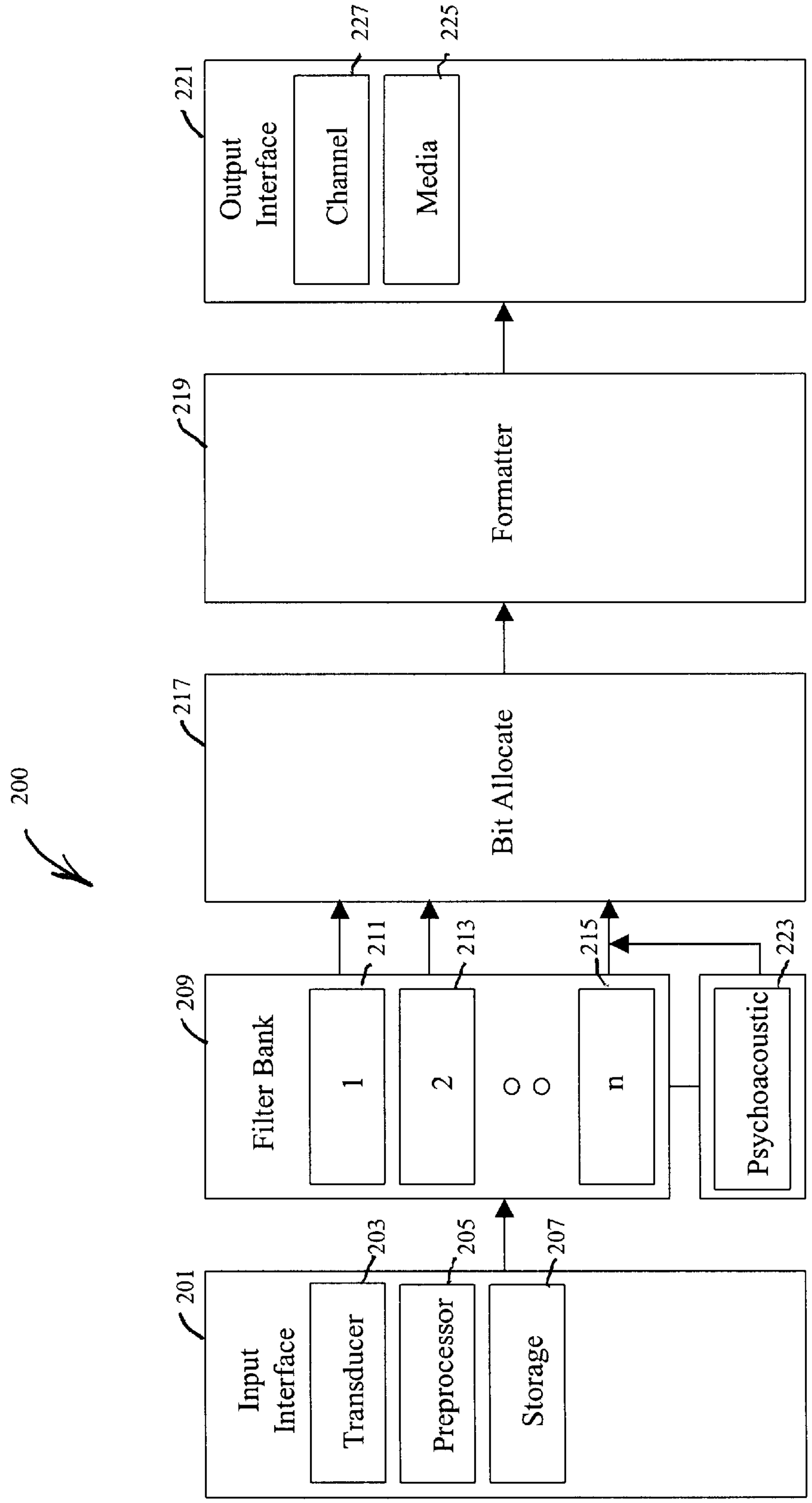
FIG. 2 is an exemplary embodiment of the encoder 103 of FIG. 1, illustrating encoding of audio samples into an MPEG compressed bit stream format.

FIG. 2 is an exemplary embodiment of the encoder 103 of FIG. 1 illustrating encoding of audio samples into an MPEG compressed bit stream format. More specifically, to compress the audio samples, an encoder 200 implements a Sub-Band Coding scheme (SBC) scheme according to MPEG-1 and MPEG-2.

The encoder 200 includes an input interface 201 having a transducer 203, a preprocessor 205 and a storage media 207. The transducer 203 is a microphone that receives a voice signal and generates a corresponding electrical audio signal (analog) signal. In response to receiving the electrical audio signal, a preprocessor 205 carries out A/D conversion, that is, sampling the analog electrical audio signal (typically at 48 KHz) before outputting corresponding PCM samples (16 bits). After sampling, the preprocessor 205 outputs PCM samples (typically 16 bits) corresponding to the analog audio signal. The PCM samples are then forwarded to a filter 209 for further processing.

Alternatively, the preprocessor 205 may "rip" information off a CD or any other recording source for conversion into a WAV file, for example. A WAV file (or other comparable audio file formats) can be received through the storage media 207. Thereafter, PCM samples obtained from the WAV file are forwarded to the filter bank 209.

The filter bank 209 is typically a polyphase filter bank that time/frequency maps the PCM samples. At least two filters 211 and 213 are included within the filter bank 209 although up to n filters 215 may be included where "n" is 32 or more filters. The filter bank 209 splits the PCM samples into at least two frequency sub-bands. For an MPEG-1 and MPEG-2 implementation, for example, the filter bank 209 is a thirty-two (32) sub-band filter bank. The 32 sub-band filter bank 209 is reasonably simple and provides adequate resolution with respect to the perceptivity of the human ear. The 32 sub-band filter bank 209 splits the PCM samples and provides a spectral resolution with 32 sub-band frequencies having equal widths. To achieve a relatively high compression, the encoder 200 exploits a phenomenon known as auditory masking wherein weaker audio signals within the critical band of a strong audio signal remain imperceptible. The information obtained from the spectral resolution permits the reduction of the bits by eliminating masked spectra within the critical bands. Further details concerning the implementation of the 32 sub-band filter bank is referenced in ISO-IEC/ITC1 SC29/WG11, Coding of Moving Pictures And Associated Audio For Digital Storage Media at Up to About 1.5 Mbits/s—Part 3: Audio, DIS 11172, April 1992.

A psycho-acoustic model 223 (required for MPEG-1 and 2 implementation) is employed to produce a masking threshold, which is, the minimum pressure level that masks a quantization noise level, for each of the 32 sub-bands of the 32 sub-band filter bank 209. The minimum masking threshold per sub-band is then used as a reference for bit allocation in the encoding of a maximum signal level. The psycho-acoustic model 223 utilizes either a 512 or 1024 point Fast Fourier Transform (FFT) to obtain detailed spectral information about the audio signal. Using the detailed spectral information, the psycho-acoustic model 223 determines where and the extent of masking of signal quantization noise, and produces a signal to mask ratio based on this information for each sub-band. The signal to mask ratio and other information relevant to determining the quantization levels is then forwarded to a bit allocation 217 module. Two psycho-acoustic model examples are further referenced in ISO-IEC/ITC1 MPEG standard, previously referenced.

The bit allocation 217 module determines the number of bits used to encode each PCM sample. For example, if the encoder encodes 32 PCM sub-bank samples, that is, one PCM sample per sub-band, a group of 12 PCM sub-band samples receive a bit allocation. If the bit allocation is not zero, then a scale factor is assigned. The scale factor maximizes the resolution of the encoder. Under certain conditions, the same scale factor can be used for a group of samples, e.g., scale factor select information (SCFSCI) indicates that the current scale factor can be used in up to three sub-band samples.

Next, the processing circuitry 123 forwards the bit allocated samples to a formatter 219. The formatter 219 formats, in one embodiment, 32 groups of 12 samples for layer 1 or 32 groups of 36 samples for layer 2 into a frame further comprising a header and error checking information. Additional information regarding MPEG-1 and MPEG-2 standards is referenced in ISO-IEC/ITC1 SC29/WG11, Coding of Moving Pictures And Associated Audio For Digital Storage Media at Up to About 1.5 Mbits/s—Part 3: Audio, DIS 11172, April 1992.

After encoding, the processing circuitry 123 then transmits the encoded bit stream through a communication channel via a channel interface 227. Alternatively, the bit stream is saved on a storage media through a storage interface 225. The storage interface 225 and the channel 227 are within an output interface 221. An output interface 221 interfaces the communication channel 223 and the storage media 225.

The encoder 200 according to the present embodiment can be implemented using a general purpose PCM-Codec Filter such as the Motorola 145500 series combined with a general purpose DSP such as the Motorola DSP 56000 series, programmed to carry out anti-aliasing, filtering, sampling and quantization of the received analog audio signal, for example, although each functionality may be achieved using separate circuitry. The psycho-acoustic models require non-linear (logarithmic and exponential) calculations and are implemented using look up tables.

The storage media 119 is a magnetic storage disk that is SCSI compliant, for example. The communication interface is an RS-232 compliant DB-9 or DB-25 serial port, for example. The communication interface may be a Network Interface Card (NIC) communicatively coupled to a Wide Area Network (WAN) or the Internet, for example. The output filter bank 121 is a conventional filter bank.

Figure 3:
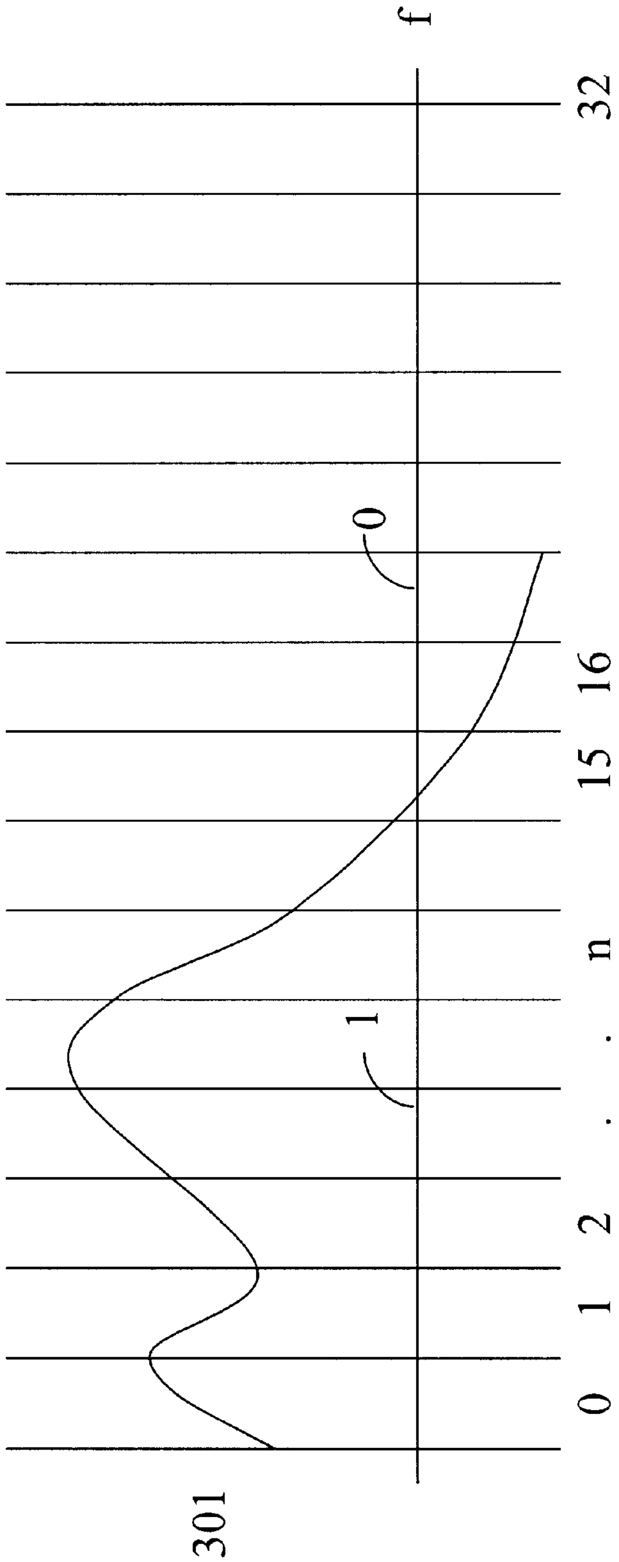
FIG. 3 is a schematic frequency domain diagram of an analog audio signal illustrating the presence of information within each frequency sub-band of the audio signal.

FIG. 3 is a schematic frequency domain diagram of an audio signal illustrating the presence of information within each frequency sub-band of the audio signal. More specifically, an audio 301 signal is sub-divided into at least two frequency sub-bands 0, 1, 2, n, where "n" represents 32 or more frequency sub-bands. The presence of information within sub-bands 0, 1, and 2, for example is indicated by a positive amplitude while a negative amplitude reflects the absence of information. Thus, when the audio 301 signal is transmitted, no information is present within the sub-band 16, so that a "0" is transmitted for sub-band 16 while a "1" is transmitted for sub-bands 0–15.

Figure 4:
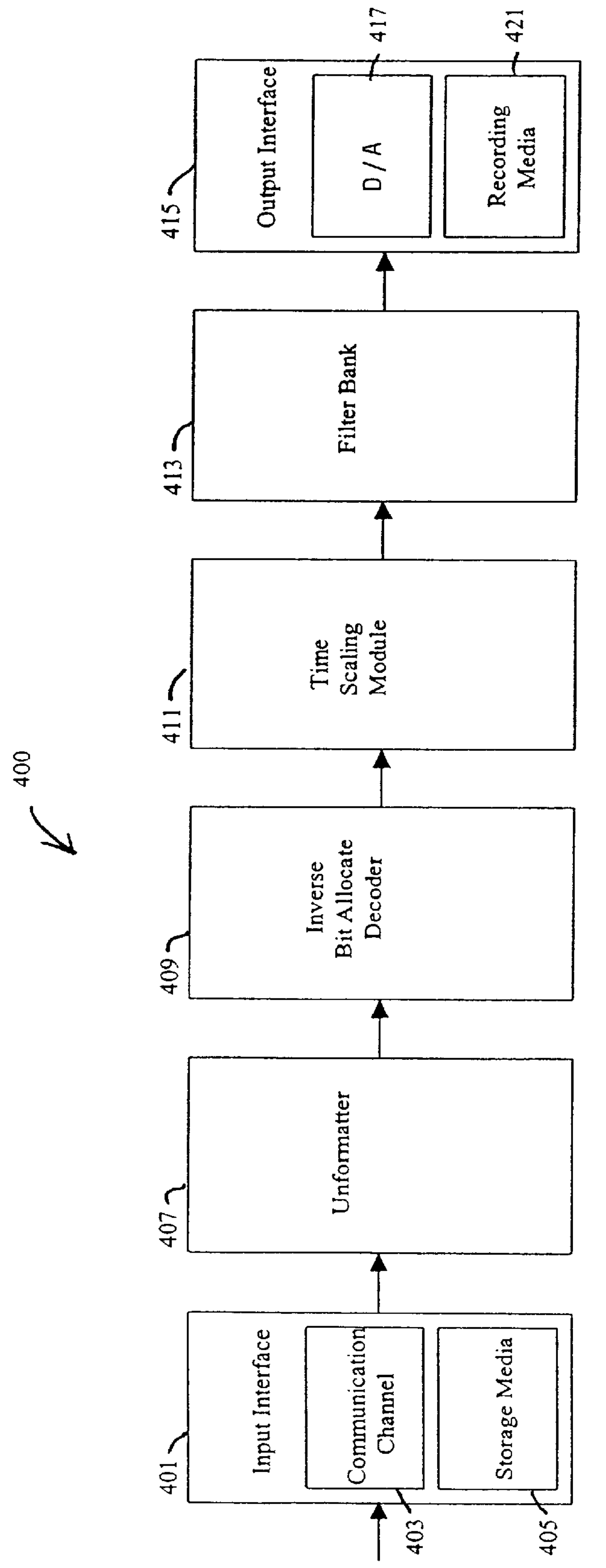
FIG. 4 is a schematic block diagram of the exemplary decoder 109 of FIG. 1, illustrating the decoding of an audio signal to permit playback with no change in pitch.

FIG. 4 is a schematic block diagram of the exemplary decoder 109 of FIG. 1, illustrating decoding of an audio signal to permit playback with no change in pitch. More specifically, a decoder 400 decodes the audio signal to enable playback. In addition, a time scaling module 411 time scales the audio signals so that playback rate is variable with no significant depreciation in sound quality of the signals.

A user wishing to utilize the decoder 400 according to the MPEG-1 layers 1 or 2 standard, for example, inputs a compressed audio signal through an input interface 401. The compressed audio signal is received from a communication channel via a communication interface 403. Alternatively, the compressed bit stream (MPEG encoded file, for example) may be received from a storage media through a storage interface 405. The communication channel interface 403 may be RS232 serial interface port or NIC, for example. Thereafter, the processing circuitry 111 (FIG. 1) forwards the audio signal to an unformatter 407 that unpacks the compressed bit streams from within a frame structure. The unformatter 407 performs the inverse functionality of the formatter 219 of FIG. 2, and uses both header and error checking information included within the bit stream during the encoding process for unpacking. Once unpacked, the processing circuitry 111 forwards the bit stream to an inverse bit allocate 409 decoder. The inverse bit allocate 409 decoder inverse allocates, de-quantizes and de-normalizes the bit stream so that the samples (typically PCM) within each sub-band is determined. Next, the processing circuitry 111 directs the PCM samples to a time scaling module 411 that applies a time scaling algorithm for time stretching or compression as further referenced in FIG. 6. Thereafter, the time scaled samples are forwarded to an output filter bank 413.

Decoder implementation is relatively simple, as no psycho-acoustic model is required. The decoder 400 may be a standard commercial decoder, for example, that decompresses encoded audio signals having at least two frequency sub-band signals. MPEG compliant sampling rates are accepted to produce a decompressed serial output that is forwarded to the time scaling module 411. As fully referenced in FIG. 6, the time scaling module 411 enables either compression or expansion of the PCM samples within at least two frequency sub-bands, to permit variable playback with no change in pitch. An output filter bank 413 includes at least two inverse filters for merging the frequency sub-bands. After the frequency sub-bands are merged, the processing circuitry 111 forwards the audio signal for D/A conversion via a D/A interface 417. The output of the D/A is fed into an amplifier and speaker to output a corresponding sound signal that can be perceived. Alternatively, the audio signal output from the filter bank 413 may be stored on a recording media 421.

Figure 5:
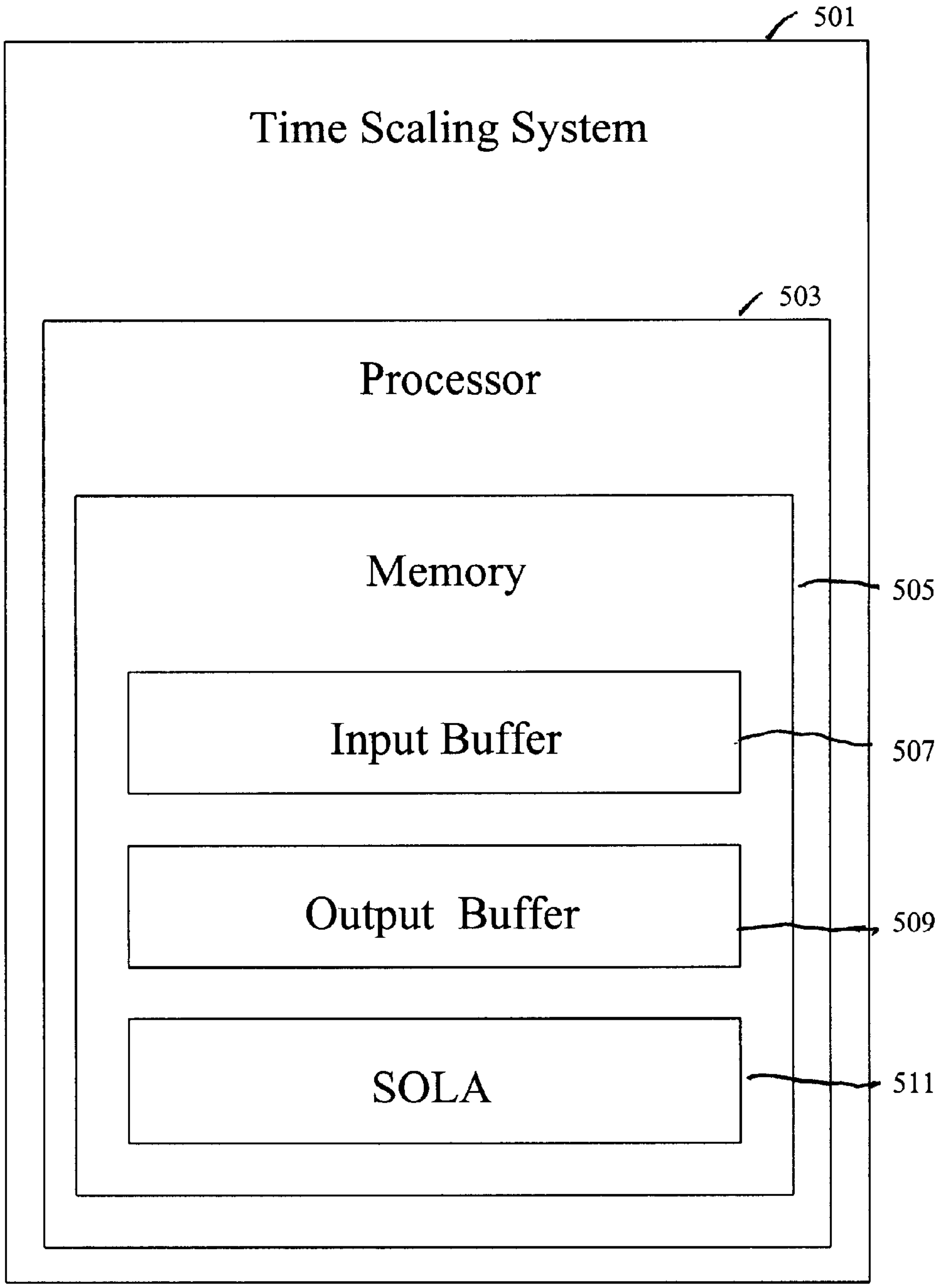
FIG. 5 is an exemplary schematic diagram of the time scaling module 411 of FIG. 4 illustrating various components for enabling variable playback of compressed audio signals with no change in pitch.

FIG. 5 is an exemplary schematic diagram of the time scaling module 411 of FIG. 4, illustrating various components for enabling variable playback of compressed audio signals with no change in pitch. A time scaling 501 module comprises a processing circuitry 503 that synchronizes and coordinates the implementation of a synchronized overlap and add (SOLA) 511 algorithm. SOLA is an algorithm that enables time stretching or compression of an audio signal. The SOLA 511 algorithm is stored within a memory 505, and may be applied separately to each frequency sub-band or applied either differently or the same to each one of the sub-bands. The processing circuitry 503 further comprises an input 507 buffer, and an output 509 buffer. Prior to SOLA, PCM sub-band samples are stored in an input frame within the input 507 buffer. Each input frame is duplicated within the output 509 buffer to form an output frame as further referenced in FIG. 6. The time scaling module 501 may be hardware, software or both.

Figure 6:
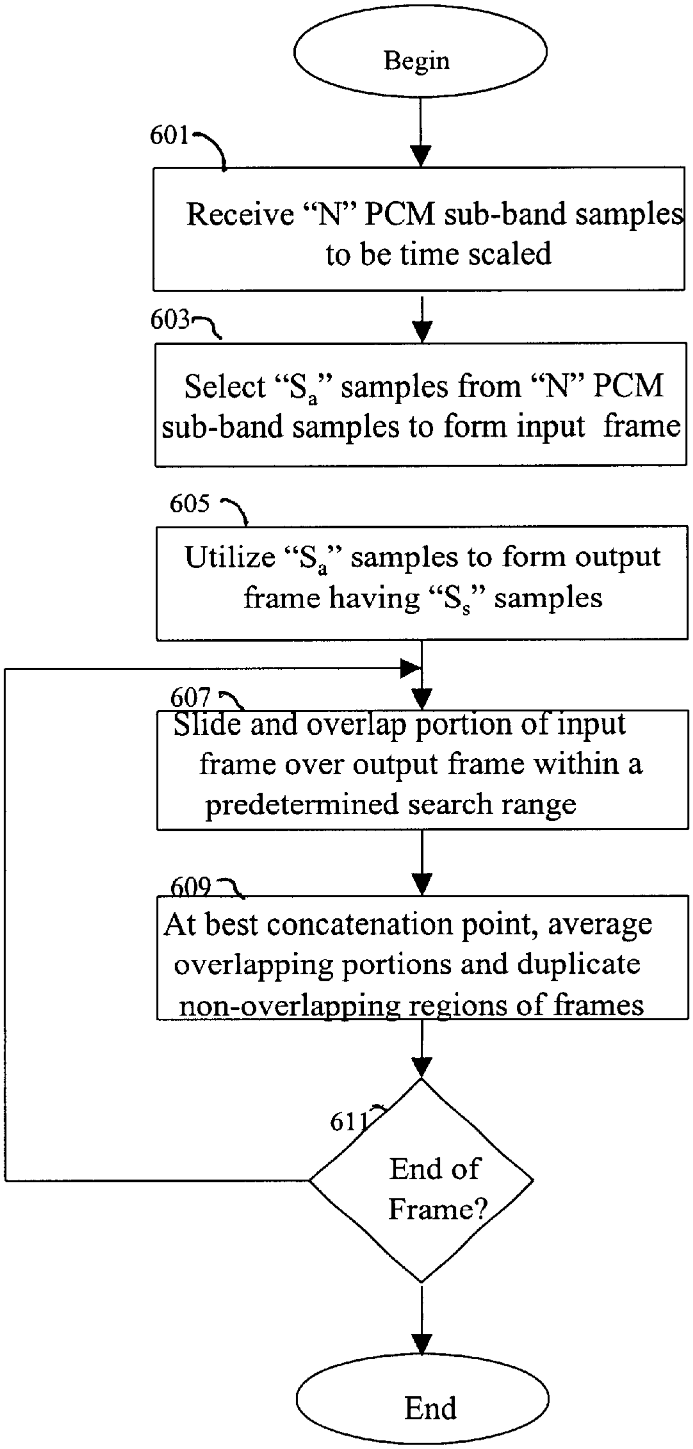
FIG. 6 is a flow diagram of exemplary steps performed by the time scaling module of FIG. 5, illustrating the time compression or time expansion of audio bit streams to enable variable playback.

FIG. 6 is a flow diagram of exemplary steps performed by the time scaling module of FIG. 5, illustrating the compression or expansion of audio bit streams to enable variable playback. The time scaling module 501 (FIG. 5) is designed to playback audio bit streams having at least two frequency sub-band samples. When MPEG-1 or MPEG-2 compliant, the time scaling module 501 receives an audio bit stream having up to 32 PCM frequency sub-band samples.

On receiving PCM sub-band samples, the time scaling module 501 applies Synchronized Overlap and Add (SOLA), a time scaling algorithm to the PCM sub-band samples. SOLA applies solely to the time domain and is applied separately to each frequency sub-band. More specifically, for MPEG 1 and MPEG 2 implementation, SOLA is applied to each of the 32 sub-bands separately. SOLA may be applied using software or a general purpose DSP such as the Motorola DSP 56000 series and software.

At a begin block 601, a PCM audio signal to be time scaled and having at least two frequency sub-band samples is received. A processing circuitry (not shown) forwards the PCM samples to a input buffer InTs Buffer [2][32][32] within the time scaling module, where 2 is number of channels, 32 the length of the input buffer, and 32 is the number of sub-bands. A user selects N input samples required to begin SOLA. Although user-selectable, N may be predetermined, having a default value of 24.

At a block 603, for each sub-band, the algorithm selects "$S_a$" samples from the "N" PCM sub-band samples to form input (analysis) frame that perform SOLA, that is, N–Sa samples are left in the input buffer when a single SOLA step is complete. Although user define-able, the value $S_a$ may have a default value.

At a block 605, the input frame having "$S_a$" samples is duplicated within an output buffer to form an output (synthesis) frame having "$S_s$" samples. Subsequent synthesis frames are obtained on a frame by frame basis by sliding each analysis frame over a previously generated synthesis frame and averaging the overlapping portions of the frames as further referenced below. The analysis and synthesis frames are related by a factor $C_{scale}$ given by:

$$S_s = S_a * C_{scale}$$

where $S_s$ and $S_a$ are the synthesis and analysis frame lengths, respectively, and $C_{scale}$ is the time scale factor where $C_{scale}<1$ represents compression and $C_{scale}>1$ represents expansion.

At blocks 607 and 609 the analysis frame is slid over the synthesis frame within a range $K_{min}$–$K_{max}$, until a best concatenation (averaging) point $K_m$ is located. The points $K_{min}$ and $K_{max}$ represent the minimum and maximum search range requirements in sub-band samples, respectively over the synthesis frame. The algorithm looks for the best time point where the synthesis frame can be concatenated with the next analysis frame. $K_{min}$ and $K_{max}$ depend upon each particular sub-band because each sub-band corresponds to a certain audio frequency. For each sub-band, $K_{min}$ and $K_{max}$ is established based on the sampling frequency of the PCM sub-band samples. For PCM sub-band samples having 32 frequency sub-bands at a sampling frequency of 32 KHz, for example, $K_{min}$ and $K_{max}$ are as follows:

| Sub-band Range | Kmin | Kmax |
|---|---|---|
| 0–3 | 0 | N/2 |
| 4–7 | $S_S - 4$ | $S_S + 4$ |
| 8–31 | $S_S$ | $S_S + 1$ |

Where N is the number of input samples, and $S_S$ is the synthesis output samples generated. Tables for various MPEG compliant sampling frequencies are similarly obtained. Each sub-band 0 through 31 comprises a certain minimum frequency that is translated into sub-band samples, and every sub-band sample corresponds to $32/F_{sampling\ frequency}$ seconds of playback. For a sampling frequency of 32 KHz, the minimum frequency width of each sub-band is 16 KHz/32=500 Hz. For the first sub-band (0), the minimum frequency is zero Hz (actually higher), for the second sub-band (1), the minimum frequency is 500 Hz, etc. Thus, the lowest frequency component in the second sub-band has a period 2 ms, etc. These are converted to sub-band samples to the determine $K_{min}$ and $K_{max}$ for table 1, above.

The best concatenation (averaging) point $k_m$ is the sample having the most similarity in both input and output. A numerical value of similarity is calculated through a normalized cross-correlation function between the analysis and the synthesis frame. For each sample k, the numerical value of similarity is given by:

$$R_m[k] = \frac{\sum_{j=0}^{L-1} y[mS_s + k + j]x[mS_a + j]}{\sqrt{\sum_{j=0}^{L-1} y^2[mS_s + k + j]\sum_{j=0}^{L-1} x^2[mS_a + j]}}$$

where m—frame number $S_s$—size of synthesis frame $S_a$—size of analysis frame k—concatenation point being tested x[n]—input sample sequence y[n]—output sample sequence Search interval $K_{min}$–$K_{max}$ must span at least one period of the lowest frequency component of the input signal.

Once the best concatenation (averaging) point $k_m$ is computed, the output samples are formed by averaging the analysis frame (fade-in gain) and the synthesis frame (fade-out gain) in the overlapped region (Ln). Samples from the non-overlapping region (N-Lm) are duplicated.

The output samples in the overlapped region is given by:

$$y[mS_s+k_m+j]=(1-g[j])y[mS_s+k_m+j]+g[j]x[mS_a+j],\ 0\leqq j<L_m$$

The output samples within the non-overlapping region is given by:

$$y[mS_s+k_m+j]=x[mS_a+j],\ L_m\leqq j<N$$

At a block 611, if an end of frame is detected, samples are fed into the analysis buffer and the concatenation process repeated until all samples are exhausted. To guarantee the pitch preserving and avoid sound quality drop-down (clicks, burst of noise or reverberation) smooth transition at the concatenation point and similar signal pattern in the overlapping interval are maintained through synchronization (or alignment) of two successive output frames at the point of the highest similarity.

Although the preceding description relates only to MPEG-1 mono, it remains valid for other configurations. While a mono stream has only one channel, a stereo stream (e.g., MPEG-2 stereo) can have up to seven independently coded channels (left, center, right, left center, right center, left surround, right surround).

Advantageously, the present embodiment significantly reduces the computation to determine the best concatenation point of the output and input frames. For example, where the number of input samples are 24, best concatenation (averaging) point computation need only be carried out for 12 samples within the sub-bands 0, 1, 2 and 3.

Although a system and method according to the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. An audio codec, that receives a first audio signal for encoding and a second audio signal for decoding, the audio codec comprising:

an encoder, further comprising,
- a memory;
- a processor, that responds to receipt of the first audio signal by directing the encoding of the first audio signal into a digital code word;

a decoder, further comprising,
- a memory;
- a processor, that directs decoding of the second audio signal to enable playback; and
- a rate adjust module, that permits variable playback of the second audio signal.

2. The audio codec of claim 1 wherein the first audio signal is an analog audio signal.

3. The audio codec of claim 1 wherein the first audio signal comprises PCM samples stored on a storage media.

4. The audio codec of claim 1 wherein the second audio signal is a compressed bit stream received through a communication channel.

5. The audio codec of claim 1 wherein the second audio is signal is a compressed bit stream of the first audio signal.

6. The audio codec of claim 1 wherein the encoder further comprises: an input filter bank that splits the first and second audio signals into a first and second sub-band frequency signals, respectively.

7. The audio codec of claim 1 wherein the encoder is MPEG-2 compliant.

8. The audio codec of claim 6 wherein the encoder further comprises:

a psycho-acoustic model, communicatively coupled to the input filter bank, the psycho-acoustic model producing a masking threshold for quantization;

a bit allocate circuitry, communicatively coupled to the psycho-acoustic model, the bit allocate circuitry assigning a fixed number of bits to samples of the first audio signal;

a formatter, communicatively coupled to the bit allocate circuitry, for frame packing the first audio signal; and an output interface, communicatively coupled to the formatter, the output interface having a communication channel interface and a storage media interface.

9. An audio decoder that receives a compressed audio bit stream for playback, the audio decoder comprising:

an input interface, that receives the compressed audio bit stream having at least a first and second frequency sub-bands;

an unformatter, communicatively coupled to the input interface, the unformatter unpacking the compressed audio bit stream from within a frame structure;

an inverse bit allocate decoder, communicatively coupled to the unformatter, the inverse bit allocate decoder inversely allocating the compressed audio bit stream to determine the input samples corresponding to each frequency sub-band; and a time scaling module, communicatively coupled to the inverse bit allocate decoder, the time scaling module time stretches the input samples within the time domain for each of the first and second frequency sub-bands to enable variable playback of the compressed audio bit stream.

10. The audio decoder of claim 9 further comprising: an output filter bank that additively recombines the first and second frequency sub-bands, and a digital to analog converter that converts the input samples to a corresponding analog signal.

11. The audio decoder of claim 9 wherein the compressed audio bit stream is MPEG-2 compliant.

12. The decoder of claim 9 wherein the time scaling module forms the input samples into an input frame and an output frame, overlaps the input and the output frames at a best averaging point, and averages the overlapped portions of the input and output frames at the best average point.

13. The decoder of claim 9 wherein the best average point is within a search range, the search range has a minimum and a maximum value in samples, the minimum and the maximum value, for each sub-band, is predetermined based on the sampling frequency of the audio samples.

14. The decoder of claim 9 wherein the time scaling module time compresses the audio samples for playback.

15. The decoder system with variable playback of claim 9 wherein the time scaling circuitry expands the audio samples for playback.

16. A method utilized by a time scaling system to manipulate samples of an audio signal, the method comprising:

receiving the audio samples having a first and a second sub-band frequency;

forming, for each of the first and second frequency sub-bands, an input and a first output frame using the audio samples;

computing a best averaging point within a search range for overlapping the input and the first output frame;

overlapping the input frame and the first output frame at the averaging point; and averaging the input and the first output frame at the best averaging point for each of the first and second sub-band frequencies to form a second output frame.

17. The method according to claim 16 wherein audio samples have thirty-two frequency sub-bands and is MPEG-2 compliant.

18. The method according to claim 16 wherein the search range has a minimum and a maximum value in samples, the minimum and the maximum value, for each sub-band, is predetermined based on the sampling frequency of the audio samples.

19. The method according to claim 16 wherein the averaging is accomplished by fading in and fading out the audio samples.

20. The method of claim 16 wherein the utilizing audio samples to form an input and an output frame further comprises determining the number of audio samples within an input frame.

21. The method according to claim 16 wherein the number of audio samples within an input frame is fixed.

22. The method according to claim 14 wherein the number of audio samples within an input frame is user-selectable.

23. The method of claim 21 further comprising selecting the number of audio input samples within an input frame required to start concatenation.

* * * * *